United States Patent
Strader et al.

(10) Patent No.: US 9,515,004 B2
(45) Date of Patent: Dec. 6, 2016

(54) THERMAL INTERFACE MATERIALS

(71) Applicant: Laird Technologies, Inc., Chesterfield, MO (US)

(72) Inventors: Jason L. Strader, Cleveland, OH (US); Karen J. Bruzda, Cleveland, OH (US); Richard F. Hill, Parkman, OH (US)

(73) Assignee: LAIRD TECHNOLOGIES, INC., Chesterfield, MO (US)

( * ) Notice: Subject to any disclaimer, the term of this patent is extended or adjusted under 35 U.S.C. 154(b) by 0 days.

(21) Appl. No.: 13/840,119

(22) Filed: Mar. 15, 2013

(65) Prior Publication Data

US 2014/0262191 A1 Sep. 18, 2014

(51) Int. Cl.
*H01L 23/427* (2006.01)
*H01L 23/42* (2006.01)
*F28F 13/00* (2006.01)

(52) U.S. Cl.
CPC ........... *H01L 23/4275* (2013.01); *H01L 23/42* (2013.01); *F28F 2013/006* (2013.01); *H01L 2924/0002* (2013.01); *Y10T 156/10* (2015.01)

(58) Field of Classification Search
None
See application file for complete search history.

(56) References Cited

U.S. PATENT DOCUMENTS

| | | | |
|---|---|---|---|
| 8,445,102 B2 | 5/2013 | Wisniewski | |
| 2004/0009353 A1 | 1/2004 | Knowles et al. | |
| 2004/0180209 A1* | 9/2004 | Cheng et al. | 428/421 |
| 2005/0045372 A1* | 3/2005 | Hill et al. | 174/252 |
| 2005/0150887 A1 | 7/2005 | Taya et al. | |
| 2009/0068387 A1 | 3/2009 | Panzer et al. | |
| 2009/0117373 A1* | 5/2009 | Wisniewski | H01L 23/3735 428/336 |
| 2010/0327430 A1* | 12/2010 | Jadhav | H01L 23/3735 257/712 |
| 2011/0030754 A1 | 2/2011 | Smythe | |
| 2012/0174956 A1 | 7/2012 | Smythe | |
| 2013/0032324 A1* | 2/2013 | Aldridge et al. | 165/185 |
| 2013/0034739 A1 | 2/2013 | Boday et al. | |

OTHER PUBLICATIONS

International Search Report and Written Opinion issued for PCT International Application No. PCT/US2013/076202 dated Mar. 19, 2014, which claims priority to the instant application;12 pages.
Utility U.S. Appl. No. 13/897,625, filed May 20, 2013, Strader.

* cited by examiner

*Primary Examiner* — Sheeba Ahmed
(74) *Attorney, Agent, or Firm* — Harness, Dickey & Pierce, P.L.C.

(57) ABSTRACT

A thermal interface material is configured for use with an electronic device for transferring heat between heat generating components and heat removing components of the electronic device. The thermal interface material generally includes a first material (e.g., a gap filler, etc.) incorporating a contact resistance reducing material. The contact resistance reducing material operates to fill interstitial voids of surfaces of components in which the first material is installed to thereby reduce surface contact resistance between the first material and the component surfaces. The contact resistance reducing material may be applied to one or more side surfaces of the first material. Or, alternatively, the contact resistance reducing material may be blended in the first material.

20 Claims, 2 Drawing Sheets

THERMAL INTERFACE MATERIALS

FIELD

The present disclosure generally relates to thermal interface materials and, more particularly, to thermal interface materials comprising first materials (e.g., materials having thermal conductivities greater than air such as, for example, gap fillers, etc.) that incorporate second materials (e.g., contact resistance reducing materials such as, for example, phase change materials, greases, oils, etc.) to thereby reduce surface contact resistance between the first materials and mating components (e.g., electronic components, etc.).

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperatures. Such excessive temperatures may adversely affect the operating characteristics of the electrical components and the operation of the associated devices.

To avoid, or at least reduce, the adverse operating characteristics from the heat generation, the heat should be removed, for example, by conducting the heat from the operating electrical components to heat sinks. The heat sinks may then be cooled by conventional convection and/or radiation techniques. During conduction, the heat may pass from the operating electrical components to the heat sinks by direct surface contact between the electrical components and heat sinks and/or by contact of the electrical components and heat sink surfaces through intermediate mediums such as thermal interface materials.

SUMMARY

This section provides a general summary of the disclosure, and is not a comprehensive disclosure of its full scope or all of its features.

The present disclosure generally relates to thermal interface materials. In some aspects of the present disclosure, the thermal interface materials may be configured for use with (e.g., installation to, etc.) electronic devices for use in transferring heat between heat generating components and heat removing components of the electronic devices.

In one example embodiment, a thermal interface material of the present disclosure generally includes a first material incorporating a second material to thereby reduce surface contact resistance between the first material and heat generating and/or heating removing components of an electronic device. The second material operates to fill interstitial voids of surfaces of the of components when the thermal interface material is used with the electronic device to thereby reduce surface contact resistance between the first material and the surfaces of the components.

In some aspects, the second material of the thermal interface material defines an outer portion of the thermal interface material. For example, the second material may be disposed along a side surface of the first material. Or, the second material may be disposed along multiple side surfaces of the first material. In some aspects, the second material of the thermal interface material is disposed at least partly within the first material. Further, in some aspects, the first material of the thermal interface material includes a gap filler.

In another example embodiment, a thermal interface material or the present disclosure generally includes a gap filler incorporating a material to thereby reduce surface contact resistance between the gap filler and heat generating and/or heating removing components of the electronic device. The material is configured to flow into interstitial voids of surfaces of the heat generating and/or heating removing components at temperatures between about 35 degrees Celsius and about 95 degrees Celsius.

The present disclosure also generally relates to methods of making thermal interface materials. Again, in some aspects of the present disclosure, the thermal interface materials may be configured for use with electronic devices for use in transferring heat between heat generating components and heat removing components of the electronic devices.

In one example embodiment, a method of making a thermal interface material generally includes incorporating contact resistance reducing material with a gap filler, whereby the contact resistance reducing material operates to reduce surface contact resistance between the gap filler and heat generating and/or heating removing components of the electronic device.

In some aspects, incorporating contact resistance reducing material with a gap filler includes applying (e.g., coating, etc.) the contact resistance reducing material to at least one surface portion of the gap filler. In other aspects, incorporating contact resistance reducing material with a gap filler includes blending (e.g., mixing, physically mixing, etc.) the contact resistance reducing material into the gap filler.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
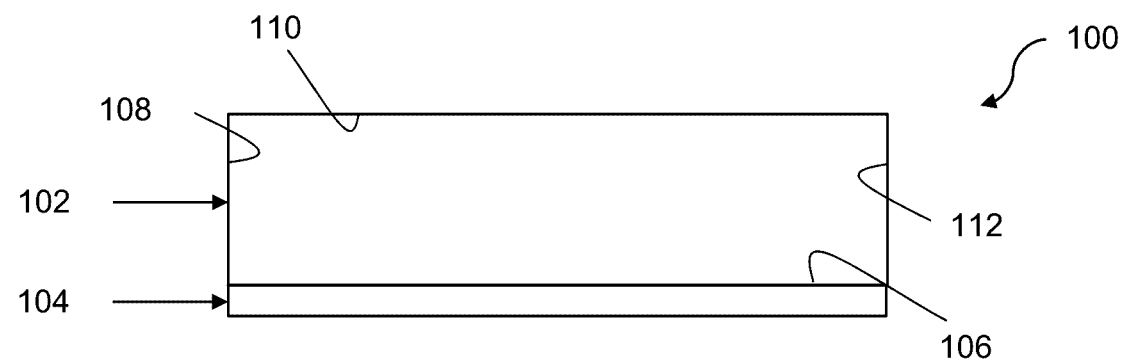
FIG. 1 is a side view of an example embodiment of a thermal interface material of the present disclosure.

The following description is merely example in nature and is in no way intended to limit the present disclosure, application, or uses.

Thermal interface materials can be used to fill gaps between thermal transfer surfaces in thermal transfer systems in order to increase thermal transfer efficiency between the surfaces, as compared to having the gaps filled simply with air which is a relatively poor thermal conductor. For example, the thermal interface materials can be placed, positioned, sandwiched, installed, etc. between surfaces of heat generating components (e.g., electronic devices, hot water devices, printed circuit board assemblies, power amplifiers, central processing units, graphics processing units, memory modules, other heat-generating components, etc.) and heat removing components (e.g., heat sinks, etc.) to thereby create a thermally-conducting heat path for transferring heat from the heat-generating components to the heat removing components.

Example embodiments of the present disclosure generally relate to thermal interface materials that comprise first materials (e.g., materials having thermal conductivities greater than air such as, for example, gap fillers, etc.) incorporating second materials (e.g., contact resistance reducing materials such as, for example, phase change materials, greases, oils, etc.) therein, thereon, therewith, etc. In some example embodiments, the second materials are applied (e.g., laminated, screen printed, spray coated, dip coated, roll coated, co-extruded, etc.) to the first materials. In some example embodiments, the second materials are blended (e.g., mixed, etc.) into the first materials. In some example embodiments, the second materials include a combination of multiple different materials.

The inventors hereof recognize that, for example, typical gap fillers provide a limited heat-conduction path between thermal transfer surfaces. Typical gap fillers generally do not conform well to the thermal transfer surfaces. The ability of the gap fillers to conform to the thermal transfer surfaces tends to be important as the surfaces are typically not perfectly flat and/or smooth (e.g., the surfaces are typically non-uniform, not flat or continuous, curved, uneven, unsymmetrical, etc.). Thus, with such typical gap fillers, air gaps or spaces often exist between the gap fillers and the thermal transfer surfaces because the gap fillers cannot fill the interstitial voids of the surfaces. As such, typical gap fillers often have generally high surface contact resistance. What's more, the inventors hereof recognize that materials of increasing thermal conductivity generally tend to have such reduced interfacial contact properties (and thus exhibit generally higher surface contact resistance). Further, the inventors hereof recognize that such surface conformance concerns are generally more prevalent in relatively thinner gap fillers.

With that said, the inventors hereof have discovered that incorporating such second materials with the gap fillers (or, for that matter, any other first materials described herein) allows for installing the gap fillers to thermal transfer surfaces with an improved conformation of the gap fillers to the thermal transfer surfaces. In particular, the second materials operate to flow into the interstitial voids of the thermal transfer surfaces during use of the gap fillers. As such, the second materials function to reduce the air gaps or spaces between the gap fillers and the thermal contact surfaces and to increase the degree of effective surface area contact between the gap fillers and the thermal contact surfaces. This reduces the surface contact resistance between the gap fillers and the thermal contact surfaces which, in turn, helps lower thermal impendence (and helps improve thermal transfer) between the gap fillers and the thermal contact surfaces (as thermal impedance depends, at least in part, upon the degree of effective surface area contact between the gap fillers and the thermal contact surfaces). Thus, the unique thermal interface materials of the present disclosure can enhance effectiveness, efficiency, etc. of heat conduction between desired thermal interface surfaces.

Various first materials can be used in connection with the thermal interface materials of the present disclosure including, for example, materials having thermal conductivities greater than air, etc. For example, such materials may include gap fillers formed (e.g., molded, etc.) from suitable polymers (e.g., elastomers, thermoplastics, combinations thereof, etc.), etc. In addition, the first materials can be provided in desired forms such as, for example, pads, sheets, cured forms, bulk forms, dispensable forms, etc. When provided in pads, sheets, etc., suitable thicknesses may range, as an example, from about 5 mils to about 300 mils (however, other thickness may be used). Further, various first materials may also include additives such as ceramics, metal particles, fiberglass, etc. and/or may be reinforced with fiberglass, metal meshes, etc. within the scope of the present disclosure.

With that said, in some example embodiments, thermal interface materials of the present disclosure may comprise first materials that include gap fillers selected from the Tflex™, Tgard™, and/or Tpli™ lines of gap fillers commercially available from Laird Technologies, Inc. of Saint Louis, Mo. (e.g., Tflex™ 300 series gap filler pads formed from ceramic filled silicone elastomer, Tflex™ 600 series gap filler pads formed from boron nitride filled silicone elastomer, Tflex™ HR600 series gap filler pads formed from metal/ceramic filled silicone elastomer, Tflex™ SF200 series gap filler formed from ceramic filled thermoplastic, etc.). Non-limiting examples of such gap fillers are provided in Table 1. Additional examples and details of gap fillers suitable for use with the thermal interface materials of the present disclosure are available at www.lairdtech.com which is incorporated herein by reference.

TABLE 1

| Name | Construction Composition | Thermal Conductivity [W/mK] | Thermal Impedance [° C.-cm$^2$/W] | Pressure of Thermal Impedance Measurement [kPa] |
| --- | --- | --- | --- | --- |
| Tflex ™ 320 | Ceramic filled silicone elastomer | 1.2 | 4.8 | 69 |
| Tflex ™ 620 | Reinforced boron nitride filled silicone elastomer | 3.0 | 3.0 | 69 |
| Tflex ™ 640 | Boron nitride filled silicone elastomer | 3.0 | 4.0 | 69 |
| Tflex ™ 660 | Boron nitride filled silicone elastomer | 3.0 | 5.5 | 69 |

TABLE 1-continued

| Name | Construction Composition | Thermal Conductivity [W/mK] | Thermal Impedance [° C.-cm$^2$/W] | Pressure of Thermal Impedance Measurement [kPa] |
|---|---|---|---|---|
| Tflex ™ 680 | Boron nitride filled silicone elastomer | 3.0 | 7.0 | 69 |
| Tflex ™ 6100 | Boron nitride filled silicone elastomer | 3.0 | 7.9 | 69 |
| Tgard ™ 210 | Silicone elastomer, fiberglass reinforced | 5 | 1.17 | 689 |
| Tpli ™ 210 | Boron nitride filled, silicone elastomer, fiberglass reinforced | 6 | 1.0 | 138 |

Various second materials can also be used in connection with the thermal interface materials of the present disclosure. For example, such second materials may include materials that will soften or change state at temperatures (or ranges of temperatures) generally corresponding to operating temperatures of electrical devices in which the thermal interface materials are to be installed (e.g., temperatures less than about 125 degrees Celsius, temperatures between about 35 degrees Celsius and about 95 degrees Celsius, temperatures between about 45 degrees Celsius and about 75 degrees Celsius, etc.). Example second materials include (but are not limited to) phase change materials, greases, oils, waxes softer gap filler materials, gap filler materials with fillers specifically optimized to surface finishes of components with which they are to interface, etc.

In addition, it should be appreciated that the second materials may or may not be thermally conductive. In some aspects, the second materials may include thermally conductive filler materials added thereto to enhance thermal conductivity (but doing so is not required). Further, in some aspects, such second materials may include materials (e.g., coatings, etc.) that can be applied to surfaces of the first materials to thereby generally form example thermal interface materials of the present disclosure. And, in other aspects, such second materials may include materials (e.g., powders, granules, etc.) that can be blended, impregnated, etc. into the first materials (e.g., during manufacturing of the first materials, after manufacturing of the first materials, etc.) to thereby generally form example thermal interface materials of the present disclosure.

With that said, in some example embodiments, thermal interface materials of the present disclosure may comprise second materials that include phase change materials selected from the Tpcm™ line of phase change materials commercially available from Laird Technologies, Inc. of Saint Louis, Mo. Non-limiting examples of such phase change materials are provided in Table 2. Additional examples and details of phase change materials suitable for use with the thermal interface materials of the present disclosure are also available at www.lairdtech.com which is incorporated herein by reference.

TABLE 2

| Name | Construction Composition | Thermal Conductivity [W/mK] | Thermal Impedance [° C.-cm$^2$/W] | Pressure of Thermal Impedance Measurement [kPa] |
|---|---|---|---|---|
| Tpcm ™ 580 Series | Non-reinforced film | 3.8 | 0.12 | 69 |
| Tpcm ™ 780 Series | Non-reinforced film | 5.4 | 0.025 | 345 |
| Tpcm ™ 905C | Non-reinforced film | 0.7 | 0.31 | 69 |
| Tpcm ™ FSF52 | Non-reinforced film | 1 | 0.27 | 69 |

In view of the foregoing, it can be appreciated that the thermal interfaced materials of the present disclosure may generally include first materials incorporating second materials to thereby reduce surface contact resistance between the first materials and mating components (e.g., surfaces of the components with the thermal interface materials interface). Thus, the thermal interface materials may be viewed as generally comprising materials (e.g., the first materials, etc.) having secondary surfaces (e.g., as generally formed by the second materials, etc.) or having surface modifications (e.g., as generally formed by the second materials, etc.) to thereby reduce the surface contact resistance between the first materials and the mating components. Further, the surface modifications may include chemical and/or physical reactions that make the surfaces of the thermal interface materials generally optimized for contact, interface, etc. with the mating components (e.g., surfaces of the mating components, etc.).

In addition, it should be appreciated that the thermal interface materials of the present disclosure may include thermal interface materials formed using the first and second materials prior to installation in desired applications (where the thermal interface materials are thus "preformed" and can then be installed to desired thermal transfer surfaces), as well as to thermal interface materials formed by, for example, first applying the second materials to the thermal transfer surfaces and then installing the first materials to the second materials (such that the thermal interface materials are generally "formed in place").

Example embodiments will now be described more fully with reference to the accompanying drawings.

FIG. 1 illustrates an example embodiment of a thermal interface material 100 including one or more aspects of the present disclosure. The thermal interface material 100 is configured to be installed in an electronic device (not shown) for use in transferring heat from a heat-generating component to a heat removing component of the electronic device.

The thermal interface material 100 of this example embodiment generally includes a gap filler pad 102 (broadly, a first material) incorporating a phase change material 104 (broadly, a second material). In the illustrated embodiment, the phase change material 104 is applied (e.g., laminated (e.g., using heated rollers, roll-to-roll laminated, using preformed gap filler pads and/or preformed phase change materials, combinations thereof, etc.), screen printed, spray coated, dip coated, roll coated, co-extruded, coated utilizing a solvent process, etc.) to a side surface 106 of the gap filler pad 102. As such, the phase change material 104 generally defines an outer portion (e.g., a layer, etc.) of the thermal interface material 100. It should be appreciated that the phase change material may alternatively be applied to one or more of side surfaces 108, 110, 112 of the gap filler pad 102, as desired, within the scope of the present disclosure. Alternatively, the phase change material may be applied to multiple ones of the side surfaces 106, 108, 110, 112 within the scope of the present disclosure.

In use, the thermal interface material 100 is positioned within an electronic device with the phase change material 104 in contact with a surface of a heat generating component and/or a heat removing component of the electronic device (to thereby transfer heat as desired). In the illustrated embodiment, the phase change material 104 also operates to help adhere the gap filler pad 102 in place in the electronic device (as opposed to using separate adhering materials such as, for example, thermally insulating pressure sensitive adhesives, etc.). The phase change material 104 is configured to soften at a temperature generally corresponding to the operating temperatures of the electronic device. As such, during operation of the electronic device, the phase change material 104 will generally flow into the interstitial voids of the surface of the heat generating component and/or the heat removing component of the device and generally conform thereto. This, in turn, effectively reduces the surface contact resistance of the gap filler pad 102, and lowers the total thermal resistance of the thermal interface material 100.

It should be appreciated that the gap filler pad 102 can include any suitable gap filler pad (e.g., one of the gap filler pads described herein, other gap filler pads, etc.). And, the phase change material 104 can include any suitable phase change material (e.g., one of the phase change materials described herein, other phase change materials, etc.).

In other example embodiments, thermal interface materials may include phase change materials (or other second materials) applied to multiple side surfaces of gap fillers (or other first materials) (e.g., gap filler pads with phase change materials applied to opposing side surfaces of the gap filler pads; gap filler pads with phase change materials applied to all side surfaces of the gap filler pads (such that the phase change materials substantially encircle the gap filler pads), etc.). In various ones of these embodiments, the phase change materials (or other second materials) may then be placed in contact with surfaces of both heat generating components and heat removing components of electronic devices.

Figure 2:
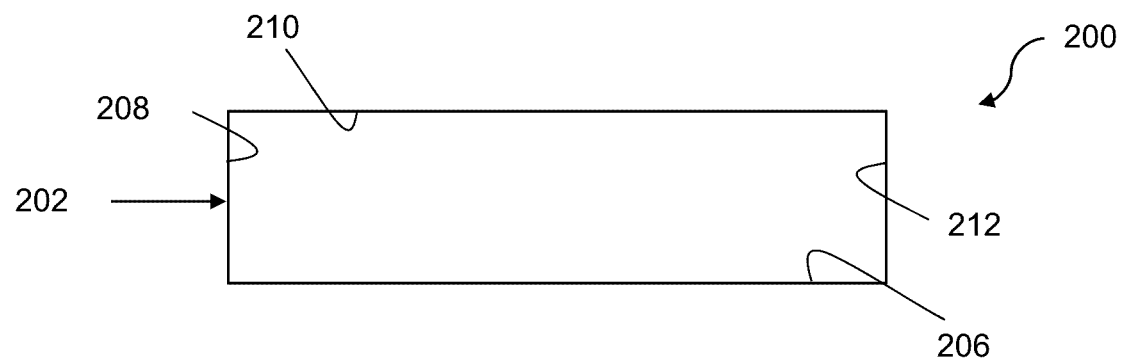
FIG. 2 is a side view of another example embodiment of a thermal interface material of the present disclosure.

FIG. 2 illustrates another example embodiment of a thermal interface material 200 of the present disclosure. The thermal interface material 200 of this example embodiment is similar to the thermal interface material 100 previously described, and is used in a similar fashion. For example, the thermal interface material 200 of this example embodiment again generally includes a gap filler pad 202 (broadly, a first material) incorporating a phase change material (broadly, a second material) (not visible). And, the thermal interface material 200 is configured for use in transferring heat from a heat-generating component to a heat removing component in an electronic device (not shown).

In this embodiment, however, the thermal interface material 200 is formed by blending (e.g., mixing, etc.) the phase change material in the gap filler pad 202. As an example (and without limitation), small particles of the phase change material are blended as filler into the gap filler pad 202 (e.g., when making the gap filler pad 202, after making the gap filler pad 202, etc.). This is done using a suitable mixing device (e.g., a planetary mixer, a sigma blade mixer, an extruder, an auger mixer, a high speed disperser, another batch mixer, etc.), etc. As such, the thermal interface material 200 of this embodiment includes properties of both the gap filler pad 202 and the phase change material. This allows the thermal interface material 200 to maintain the general properties of the gap filler pad 202 (e.g., easy handling and assembly, appearance, recovery after deflection, etc.), while also exhibiting the properties of the phase change material during use. For example, the phase change material portion of the thermal interface material 200 can melt and/or flow at surface portions of the gap filler pad 202 (e.g., surface portions 206, 208, 210, 212 of the gap filler pad 202, other surface portions of the gap filler pad 202, etc.) into interstitial voids of the surface to which the thermal interface material 200 is installed (e.g., at a temperature generally corresponding to the operating temperatures of the electronic device, etc.).

Additionally in this example embodiment, the phase change material that is blended into the gap filler pad 202 is designed so that when heated during normal operating temperatures it will migrate to the surface, similar to a mold release, resulting in the phase change material filling in the interstitial voids that remain between the gap filler pad 202 and the surface(s) of a heat generating component and/or a heat removing component. For example, the phase change material will migrate from areas of generally higher pressure (inside the gap filler pad 202) to the areas of lower pressure (e.g., the interstitial voids between the gap filler pad 202 and the heat generating component and/or heat removing component) resulting in displacement of any remaining air therein, thereby effectively reducing the contact resistance of the gap filler pad 202.

EXAMPLES

The following examples are example in nature. Variations of the following examples are possible without departing from the scope of the disclosure.

Example 1

In this example, various thermal interface materials were evaluated to provide an illustration of the general relationship between thermal conductivity (W/mK) of the materials, thickness of the materials, and the percentage contribution of surface contact resistance ($R_c$) to total thermal resistance ($R_{th}$) of the materials in use (where the total thermal resistance ($R_{th}$) of the materials in use comprises the sum of the thermal resistance of the material ($R_m$) and the surface contact resistance ($R_c$) between the material and an interface surface).

Figure 3:
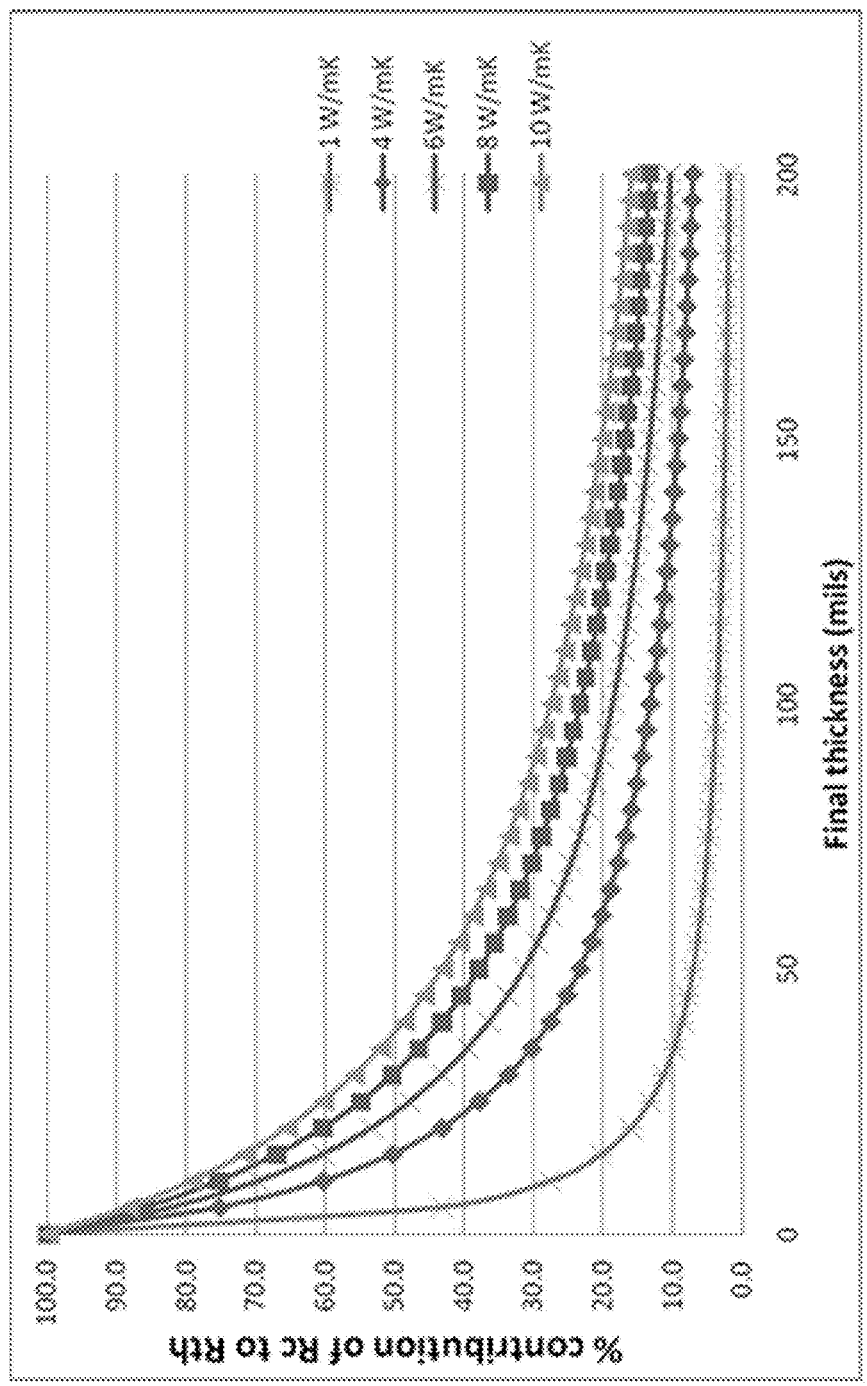
FIG. 3 is a graph illustrating an example relationship between thermal conductivity (W/mK), thickness, and a percentage contribution of surface contact resistance ($R_c$) to total thermal resistance ($R_{th}$) for thermal interface materials.

The results from this example are illustrated graphically in FIG. 3. As can be seen, as thermal conductivity of the materials increases, surface contact resistance comprises an increased percent of the total thermal resistance of the materials. Similarly, as thickness of the materials decreases, surface contact resistance also comprises an increased percent of the total thermal resistance of the materials.

Example 2

In this example, a thermal interface material was formed by laminating Tpcm™ 580 Series phase change material to both sides of a Tpli™ 210 gap filler pad (both from Laird Technologies, Inc. of Saint Louis, Mo.). In particular, a preformed sheet of the Tpcm™ 580 Series phase change material was laminated to both sides of a preformed sheet of the Tpli™ 210 gap filler pad at room temperature. The thickness of the sheet of the Tpcm™ 580 Series phase change material was about 3 mils, and the thickness of the sheet of the Tpli™ 210 gap filler pad was about 7 mils (although, in other examples, other thicknesses of the materials may be used).

Thermal resistance was then measured for both the Tpli™ 210 gap filler pad (without the Tpcm™ 580 Series phase change material) and for the laminated thermal interface material (the Tpli™ 210 gap filler pad with the Tpcm™ 580 Series phase change material laminated thereon). For both, the thermal resistance was measured in accordance with the American Society for Testing and Materials (ASTM) D-5470 standard for measuring thermal impedance for thermal interface materials (which is incorporated herein by reference), using an ASTM D-5470 thermal resistance testing instrument. The test conditions were performed at a temperature of about 70 degrees Celsius, and with a constant gap set to about 5% deflection of the measured thickness of the 13 mil total thickness of the laminated thermal interface material. The laminated thermal interface material demonstrated lower thermal resistance as compared to the Tpli 210 gap filler pad alone (without the Tpcm™ 580 Series phase change material).

Example 3

In this example, a thermal interface material was formed by laminating Tpcm™ 780 phase change material to both sides of a Tflex™ 600 gap filler pad (both from Laird Technologies, Inc. of Saint Louis, Mo.). In particular, a preformed sheet of the Tpcm™ 780 phase change material was laminated to both sides of a preformed sheet of the Tflex™ 600 gap filler pad at room temperature. The thickness of the sheet of the Tpcm™ 780 phase change material was about 3 mils, and the thickness of the sheet of the Tflex™ 600 gap filler pad was about 7 mils (although, in other examples, other thicknesses of the materials may be used).

Thermal resistance was then measured for both the Tflex™ 600 gap filler pad (without the Tpcm™ 780 phase change material) and for the laminated thermal interface material (the Tflex™ 600 gap filler pad with the Tpcm™ 780 Series phase change material laminated thereon). For both, the thermal resistance was measured in accordance with the American Society for Testing and Materials (ASTM) D-5470 standard for measuring thermal impedance for thermal interface materials (which is incorporated herein by reference), using an ASTM D-5470 thermal resistance testing instrument. The test conditions were performed at a temperature of about 70 degrees Celsius, and with a constant gap set to about 5% deflection of the measured thickness of the 13 mil total thickness of the laminated thermal interface material. The laminated thermal interface material demonstrated about a 30% reduction in thermal resistance as compared to the Tflex™ 600 gap filler pad alone (without the Tpcm™ 780 phase change material).

Example 4

In this example, thermal impedance (° C.-in$^2$/W) was measured and compared for several samples of thermal interface materials. A first group of samples included various different types of gap fillers from the Tflex™, Tpli™, and Tgard™ lines of gap fillers from Laird Technologies, Inc. (Saint Louis, Mo.). This group of samples did not incorporate any second materials. A second group of samples included the same type of gap fillers from the first group of samples, but further included phase change materials (PCM) from the Tpcm™ line of phase change materials gap fillers from Laird Technologies, Inc. (Saint Louis, Mo.) applied to the heated sides of the gap fillers (e.g., to sides of the gap fillers applied to heat generating components, etc.). And, a third group of samples included the same type of gap fillers from the first group of samples, but further included phase change materials (PCM) from the Tpcm™ line of phase change materials gap fillers from Laird Technologies, Inc. (Saint Louis, Mo.) applied to the heated and cooled sides of the gap fillers (e.g., to sides of the gap fillers applied to heat generating components and heat removing components, etc.). The second and third group of samples were formed generally using the procedures previously described in Examples 2 and 3. And, thermal impedance was measured in accordance with ASTM D-5470 as generally described in Examples 2 and 3.

In evaluating the samples, a first comparison was made for the samples where pressure was maintained generally constant at about 10 pounds per square inch. In this comparison, the phase change material applied to the gap fillers was Tpcm™ 780. And, a second comparison was made for the samples with a constant gap set to about 5% deflection. In this comparison, the phase change material applied to the gap fillers was Tpcm™ 583. The results from the first comparison are provided in Table 3, and the results from the second comparison are provided in Table 4. As can be seen, for each of the materials, the thermal impedance decreased with the addition of the phase change material (PCM) to the heated side of the material. And, the thermal impedance then further decreased with the addition of the phase change material to both the heated and cooled sides of the material.

TABLE 3

| Gap Filler Name | Gap Filler Only | Thermal Impedance [° C.-in²/W] Gap Filler with Tpcm ™ 780 Applied to Heated Side | Gap Filler with Tpcm ™ 780 Applied to Heated and Cooled Sides |
|---|---|---|---|
| Tflex ™ 2100V0 | 3.501 | 3.204 | 2.785 |
| Tflex ™ 3100 | 3.038 | 3.166 | 2.565 |
| Tflex ™ 5100 | 1.523 | 1.325 | 1.187 |
| Tflex ™ 6100 | 2.225 | 2.167 | 1.684 |
| Tflex ™ 7100 | 0.885 | 0.821 | 0.803 |

TABLE 4

| Gap Filler Name | Gap Filler Only | Thermal Impedance [° C.-in²/W] Gap Filler with Tpcm ™ 583 Applied to Heated Side | Gap Filler with Tpcm ™ 583 Applied to Heated and Cooled Sides |
|---|---|---|---|
| Tpli ™ 210 | 1.163 | 0.567 | 0.312 |
| Tgard ™ 210 | 0.797 | N/A | 0.481 |

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In addition, the disclosure of particular values (e.g., thermal conductivities, thermal impedances, pressures of thermal impedances, etc.) herein is not exclusive of other values that may be useful in other example embodiments. Moreover, it is envisioned that any two particular values for a specific parameter stated herein may define the endpoints of a range of values that may be suitable for the given parameter. The disclosure of a first value and a second value for a given parameter can be interpreted as disclosing that any value between the first and second values could also be employed for the given parameter. Similarly, it is envisioned that disclosure of two or more ranges of values for a parameter (whether such ranges are nested, overlapping or distinct) subsume all possible combination of ranges for the value that might be claimed using endpoints of the disclosed ranges.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A thermal interface material configured for use with an electronic device for transferring heat between heat generating components and heat removing components of the electronic device, the thermal interface material comprising a first material including polymer and a second material including a contact resistance reducing material to thereby reduce surface contact resistance between the first material and heat generating and/or heating removing components of the electronic device, wherein a distinct layer of the second material is applied to and disposed along a side surface of the first material, and wherein:
the second material has a phase change softening temperature less than 125 degrees Celsius; and
the second material conforms to a thermal transfer surface when the thermal interface material is installed and the second material is between the first material and the thermal transfer surface, whereby the second material fills interstitial voids of the thermal transfer surface and/or reduces air gaps between the first material and the thermal transfer surface.

2. The thermal interface material of claim 1, wherein the second material is applied to, disposed along and distinct from multiple side surfaces of the first material.

3. The thermal interface material of claim 1, wherein the distinct layer of the second material is a non-reinforced film phase change material on the side surface of the first material that defines an outermost portion of the thermal interface material.

4. The thermal interface material of claim 1, wherein the first material includes a silicone elastomer gap filler, whereby the second material allows for installing the silicone elastomer gap filler to the thermal transfer surface such that the second material is between the silicone elastomer gap filler and the thermal transfer surface and such that the second material conforms to the thermal transfer surface and reduces air gaps between the silicone elastomer gap filler and the thermal transfer surface.

5. The thermal interface material of claim 4, wherein the second material includes a non-reinforced film phase change material on at least one side surface of the silicone elastomer gap filler.

6. The thermal interface material of claim 1, wherein the contact resistance reducing material is laminated, screen printed, coated, or co-extruded on the side surface of the first material.

7. The thermal interface material of claim 1, wherein the first material includes a preformed sheet of gap filler pad and the second material includes a preformed sheet of phase change material laminated to and disposed along both sides of the preformed sheet of gap filler pad.

8. The thermal interface material of claim 1, wherein the first material includes a thermoplastic gap filler, whereby the second material allows for installing the thermoplastic gap filler to the thermal transfer surface such that the second material is between the thermoplastic gap filler and the thermal transfer surface and such that the second material conforms to the thermal transfer surface and reduces air gaps between the thermoplastic gap filler and the thermal transfer surface.

9. The thermal interface material of claim 8, wherein the second material includes a non-reinforced film phase change material on at least one side surface of the thermoplastic gap filler.

10. The thermal interface material of claim 9, wherein the non-reinforced film phase change material is laminated to and disposed along both sides of the thermoplastic gap filler.

11. The thermal interface material of claim 1, wherein the first material includes an elastomer gap filler, whereby the second material allows for installing the elastomer gap filler to the thermal transfer surface such that the second material is between the elastomer gap filler and the thermal transfer surface and such that the second material conforms to the thermal transfer surface and reduces air gaps between the elastomer gap filler and the thermal transfer surface.

12. The thermal interface material of claim 11, wherein the second material includes a non-reinforced film phase change material on at least one side surface of the elastomer gap filler.

13. The thermal interface material of claim 12, wherein the non-reinforced film phase change material is laminated to and disposed along both sides of the elastomer gap filler.

14. The thermal interface material of claim 1, wherein the second material is laminated to and disposed along both sides of the first material.

15. The thermal interface material of claim 1, wherein the first material includes a ceramic filled silicone elastomer gap filler.

16. The thermal interface material of claim 1, wherein the first material includes a boron nitride filled silicone elastomer gap filler.

17. The thermal interface material of claim 1, wherein:
the first material includes a boron nitride filled silicone elastomer gap filler; and
the second material includes a non-reinforced film phase change material laminated to and disposed along both sides of the boron nitride filled silicone elastomer gap filler.

18. The thermal interface material of claim 1, wherein:
the first material includes a silicone elastomer gap filler; and
the second material includes a non-reinforced film phase change material laminated to and disposed along both sides of the silicone elastomer gap filler.

19. The thermal interface material of claim 1, wherein the first material includes a gap filler pad formed from ceramic filled silicone elastomer, boron nitride filled silicone elastomer, metal/ceramic filled silicone elastomer, or ceramic filled thermoplastic.

20. An electronic device comprising a heat generating and/or heating removing component and the thermal interface material of claim 1 positioned within the electronic device with the second material in contact with a surface of the heat generating and/or heating removing component, wherein the second material operates to flow into and fill interstitial voids of the surface of the heat generating and/or heating removing component and conform thereto to thereby reduce surface contact resistance between the first material and the heat generating and/or heating removing component and lower thermal resistance of the thermal interface material.

* * * * *